United States Patent
Chen et al.

(10) Patent No.: US 7,193,441 B2
(45) Date of Patent: Mar. 20, 2007

(54) SINGLE GATE OXIDE I/O BUFFER WITH IMPROVED UNDER-DRIVE FEATURE

(75) Inventors: Kuo-Ji Chen, Taipei county (TW); Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 10/993,054

(22) Filed: Nov. 18, 2004

(65) Prior Publication Data
US 2006/0103435 A1 May 18, 2006

(51) Int. Cl.
*H03K 19/0175* (2006.01)
*H03L 5/00* (2006.01)

(52) U.S. Cl. ............... 326/81; 326/83; 326/86; 327/333; 327/112

(58) Field of Classification Search .......... 326/81; 327/333, 112
See application file for complete search history.

(56) References Cited

U.S. PATENT DOCUMENTS

| 6,018,257 | A * | 1/2000 | Hung et al. | 327/112 |
| 6,081,132 | A * | 6/2000 | Isbara | 326/81 |
| 6,333,663 | B1 * | 12/2001 | Lee | 327/333 |
| 6,388,499 | B1 * | 5/2002 | Tien et al. | 327/333 |

* cited by examiner

*Primary Examiner*—Vibol Tan
(74) *Attorney, Agent, or Firm*—Duane Morris LLP

(57) ABSTRACT

A high voltage buffer module used in an input/output buffer circuit coupled between a high voltage circuit and a low voltage circuit, operates between a first supply voltage and its complementary second supply voltage. A pull-up module, coupled between the first supply voltage and an output node, outputs the first supply voltage to the output node, in response to an input signal. A voltage detection circuit provides the pull-up module with at least one bias voltage selected from a predetermined set of voltage levels, wherein the voltage detection circuit selects the bias voltage upon detecting a reduction of the first supply voltage.

33 Claims, 7 Drawing Sheets

SINGLE GATE OXIDE I/O BUFFER WITH IMPROVED UNDER-DRIVE FEATURE

BACKGROUND

The present disclosure relates generally to semiconductor devices, and more particularly to single gate oxide (SGO) input/output (I/O) buffer circuits with an improved under-drive feature.

Demands are escalating for sub-micron semiconductor devices with high density, high performance, and ultra large-scale integration. These semiconductor devices require increased speeds, high reliability, and increased manufacturing throughput. As the semiconductor device geometries continue to decrease, the conventional semiconductor technologies are challenged in forming gate oxide layers.

Conventional semiconductor devices comprise a substrate having various electrically isolated regions, called active regions, in which individual circuit components are formed. The active region typically includes source and drain regions of a transistor formed in the semiconductor substrate, spaced apart by a channel region. A gate electrode for switching the transistor is formed on the channel with a gate oxide layer isolating the gate electrode and the substrate. The quality and thickness of the gate oxide are crucial for the performance and reliability in the finished integrated circuit (IC) device.

The speed of circuit components, such as MOS transistors, is affected by the time required to charge and discharge parasitic load capacitances in a circuit. Since a lower operating voltage leads to a shorter time of charging and discharging the load capacitances, faster circuitry is typically therefore obtained. In order to reduce the operating voltage, however, the threshold voltage of the transistor must also be lowered. One way to lower the threshold voltage is to reduce the thickness of the gate oxide layer, which contributes proportionately to the body effect and hence, the threshold voltage.

The reliability of transistor is also affected by the thickness of its gate oxide. For example, if an excessive potential is applied to the gate electrode, the gate oxide breaks down and causes a short circuit, typically, between the gate electrode and the source. The potential at which the gate oxide breakdown occurs is termed the "breakdown voltage," which is related to the thickness of the gate oxide. Since the gate oxide layer must be thick enough to prevent a breakdown, a higher operating voltage necessitates a thicker gate oxide to support a higher breakdown voltage.

Some semiconductor devices have circuit components operating at different voltages within the same IC. For example, a microprocessor has speed-critical components that are operated at lower voltages (e.g., 1.8V to 2.0V), while it may also contain less speed-critical components that operate at higher operating voltages (e.g., 3.3V to 5.0V). Transistors utilizing a low operating voltage (e.g., 1.8V) have a thinner gate oxide layer (typically 40 Angstroms), while transistors with higher operating voltages (e.g., 5V) have a thicker gate oxide layer (typically 55 Angstroms). This increase in the gate oxide thickness makes the gate oxide less susceptible to a breakdown.

Input/output (I/O) buffer circuits typically need to translate an input operating voltage to a higher or lower operating voltage. I/O buffer circuits are used when two distinct circuits having different operating voltages need to be connected. Conventional designs have utilized dual gate oxide structures or stack transistor schemes to reduce the effects of gate oxide breakdown. These conventional designs provide some measure of protection from gate oxide breakdown, but unfortunately have performance limitations (such as under-drive anomaly), which lead to additional masks, process steps, and fabrication costs.

Therefore, desirable in the art of gate oxide I/O buffer circuits are new designs that utilize a single gate oxide structure with an improved under-drive feature to increase I/O buffer circuit performance, to reduce the process steps, to reduce the fabrication costs, and to obtain higher throughput.

SUMMARY

The present invention discloses a high voltage buffer module used in an input/output buffer circuit coupled between a high voltage circuit and a low voltage circuit, the high voltage buffer module being operated between a first supply voltage and its complementary second supply voltage. In one embodiment, the high voltage buffer modules includes a pull-up module, coupled between the first supply voltage and an output node, for outputting the first supply voltage to the output node, in response to an input signal. A voltage detection circuit is used for providing the pull-up module with at least one bias voltage selected from a predetermined set of voltage levels, wherein the voltage detection circuit selects the bias voltage upon detecting a reduction of the first supply voltage.

The construction and method of operation of the invention, however, together with additional objects and advantages thereof will be best understood from the following description of specific embodiments when read in connection with the accompanying drawings.

Although the invention is illustrated and described herein as embodied in circuits for a single gate oxide structure with an under-drive feature to increase I/O buffer circuit performance, it is nevertheless not intended to be limited to the details shown, since various modifications and structural changes may be made therein without departing from the spirit of the invention and within the scope and range of equivalents of the claims.

DESCRIPTION

The present invention discloses a single gate oxide high voltage buffer module, used in I/O buffer circuits, with an improved under-drive feature. These circuits are designed to protect the gate oxide layers of transistors without using dual gate oxide structures in the I/O buffer circuits, which are typical in conventional designs. Instead, these circuits incorporate an improved under-drive feature that ensures a proper I/O buffer circuit operation at various supply voltages. The elimination of the dual gate oxide structures reduces the use of fabrication masks, process steps, and costs.

Figure 1:
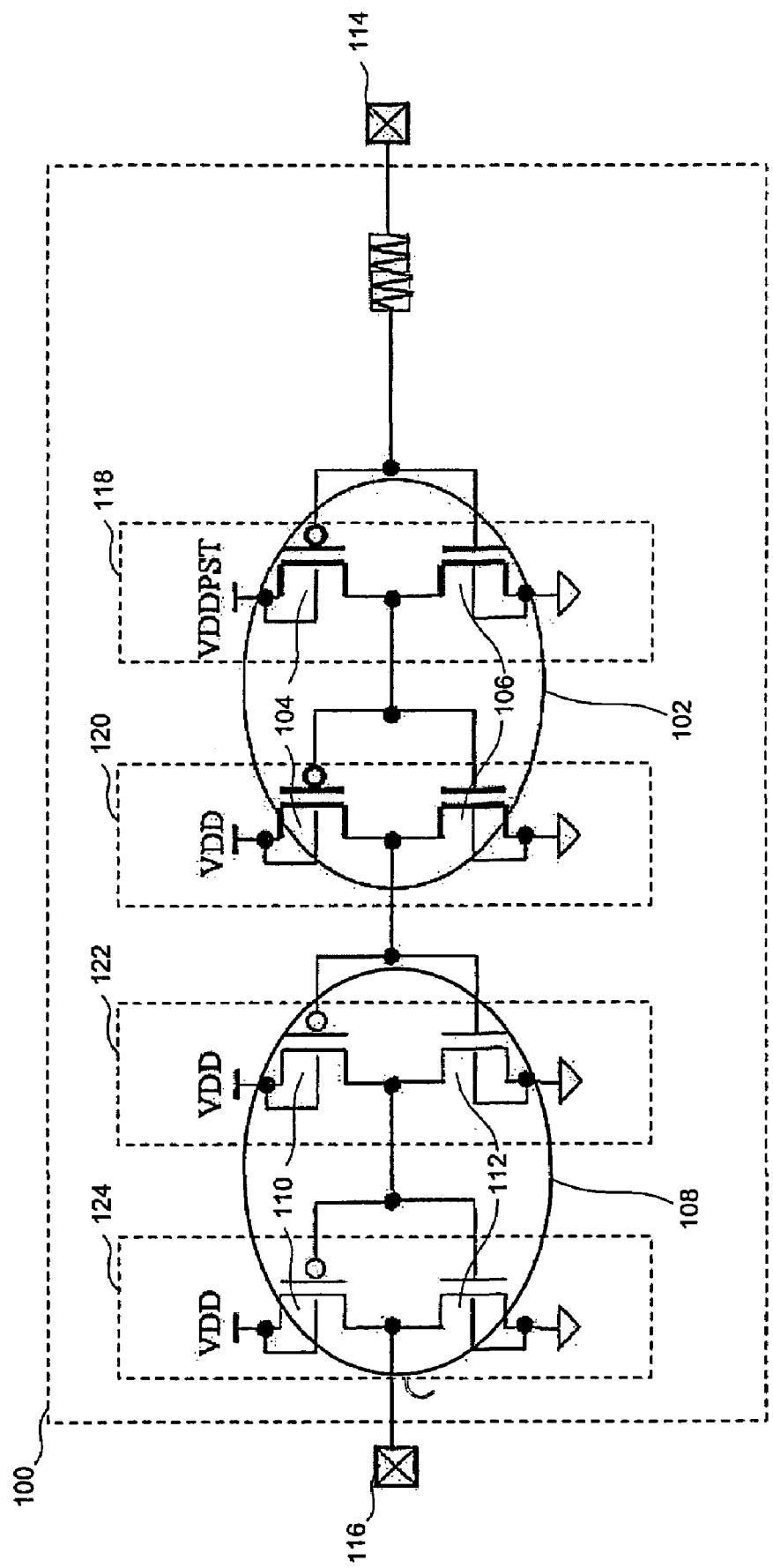
FIG. 1 presents a conventional dual gate oxide I/O buffer circuit.

FIG. 1 presents a conventional dual gate oxide I/O buffer circuit 100. The I/O buffer circuit 100 utilizes both thin and thick gate PMOS and NMOS transistors. A high voltage level shifter 102 contains thick gate oxide PMOS transistors 104 and NMOS transistors 106. A low voltage buffer module 108 contains thin gate oxide PMOS transistors 110 and NMOS transistors 112. The I/O buffer circuit 100 provides voltage translation from an input pad 114 operating at a high supply voltage (such as, 3.3 V, labeled as "VDDPST") to an output pad 116 operating at a low supply voltage (such as, 1.8V, labeled as "VDD"). Therefore, the signal operating range of the input pad 114 is from 0V to 3.3V, while the signal operating range of the output pad 116 is from 0V to 1.8V. This I/O buffer circuit 100 allows for input circuits operating at a high supply voltage to interface with output circuits operating at a low supply voltage, without gate oxide voltage stress damage to a low voltage circuit connected to the output pad 116 by using the dual gate oxide structures.

The I/O buffer circuit 100 is comprised of four inverters 118, 120, 122 and 124. The inverter 118 utilizes VDDPST as its supply voltage to interface with a high voltage circuit connected to the input pad 114. Due to this high supply voltage, the PMOS and NMOS transistors utilize thick gate oxide layers to prevent gate oxide breakdown. The inverted output of the inverter 118 is sent to the inverter 120, which operates at a low supply voltage, such as VDD. However, to protect the gates of the PMOS and NMOS transistors in the inverter 120 from the input signal operating at VDDPST, both the PMOS and NMOS transistors in the inverter 120 utilize a thick gate oxide layer. Because the inverted output of the inverter 120 operates between VDD and 0V, the inverters 122 and 124 need only thin gate oxide layers. The inverters 122 and 124 are utilized as buffers between the input high voltage circuit and the output low voltage circuit. Since each inverter is inverting, 4 inverting stages are required to ensure that the output signal at the output pad 116 has the same polarity as the input signal at the input pad 114.

The I/O buffer circuit 100 withstands higher input operating voltages without gate oxide damage. However, this design requires an additional mask, increased process steps, and, therefore, higher fabrication costs, due to the dual gate oxide structures.

Figure 2A:
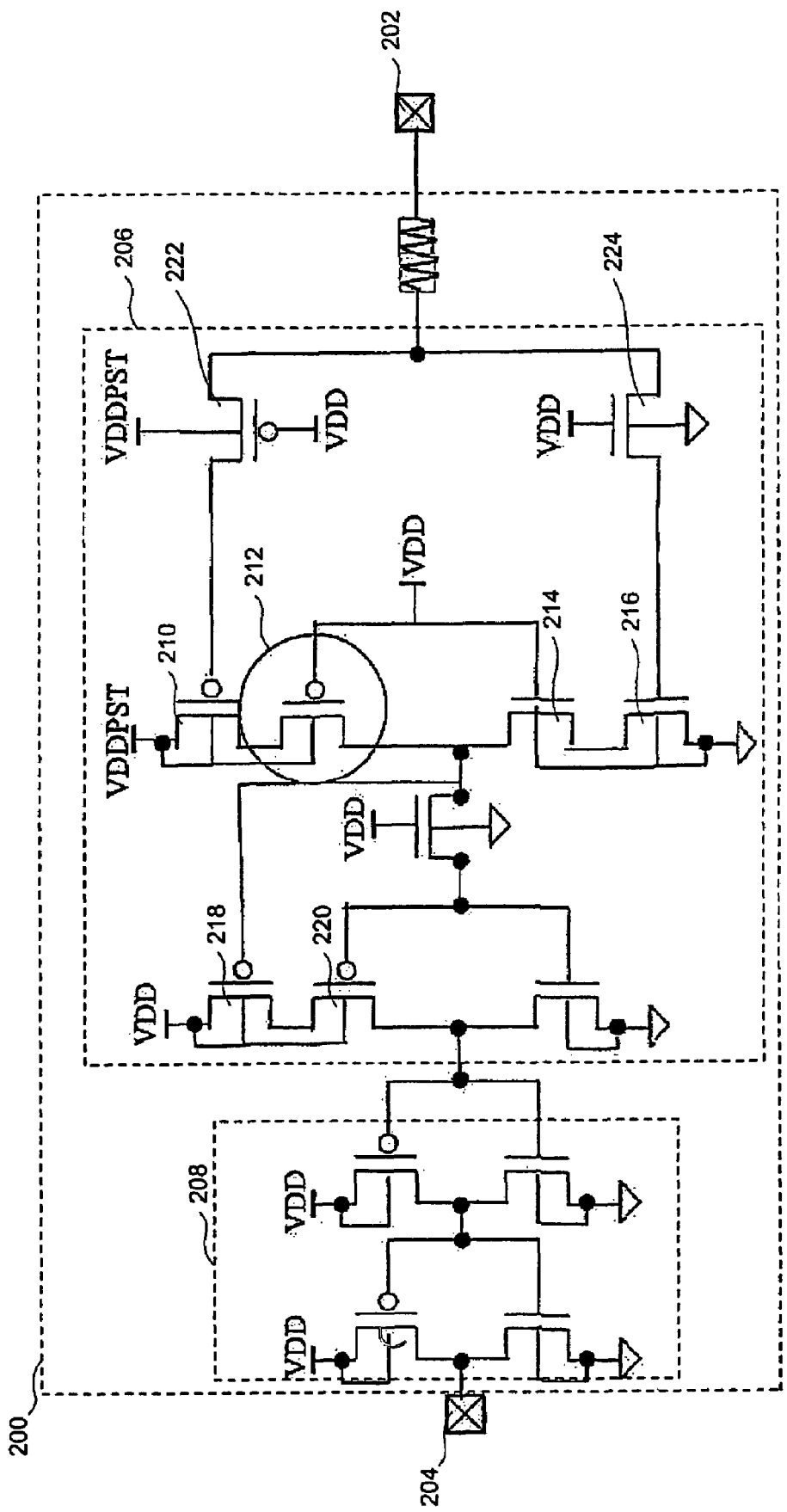
FIG. 2A presents a conventional SGO I/O buffer circuit.

FIG. 2A presents a conventional SGO I/O buffer circuit 200. An input pad 202 has an input voltage, which swings from a high supply voltage, such as VDDPST (3.3V), to a complementary supply voltage, such as VSS (0V), and drives an output pad 204, which has a voltage swing from a low supply voltage, such as VDD (1.8V), to the complementary supply voltage, such as VSS (0V). The I/O buffer circuit 200 utilizes only a single gate oxide (SGO) layer for each transistor throughout a high voltage level shifter 206 and a low voltage buffer module 208. In the I/O buffer circuit 200, stacked PMOS transistors 210 and 212, NMOS transistors 214 and 216, and PMOS transistors 218 and 220 divide the gate oxide voltage among multiple transistors to prevent damage to the gate oxide layers. Series pass transistors 222 and 224 operate within the gate oxide voltage limitations, and, therefore, do not require multiple transistors or a thick gate oxide.

The use of only a SGO layer in the I/O buffer circuit 200 in place of the dual gates used in the I/O buffer circuit 100 eliminates the need of additional masks and fabrication steps. However, the I/O buffer circuit 200 suffers from the under-drive problem that can cause SGO buffer circuit failure. In this scenario, the high supply voltage VDDPST (e.g., 3.3V) is reduced to the point where the difference between the high supply voltage and the low supply voltage (VDDPST−VDD) is approximately equal to, or less than, the absolute value of the threshold voltage ($V_{THP}$) of the PMOS transistor 212. In such case, the PMOS transistor 212 has insufficient gate voltage drive to turn "ON", thereby resulting in I/O buffer circuit failure.

Figure 2B:
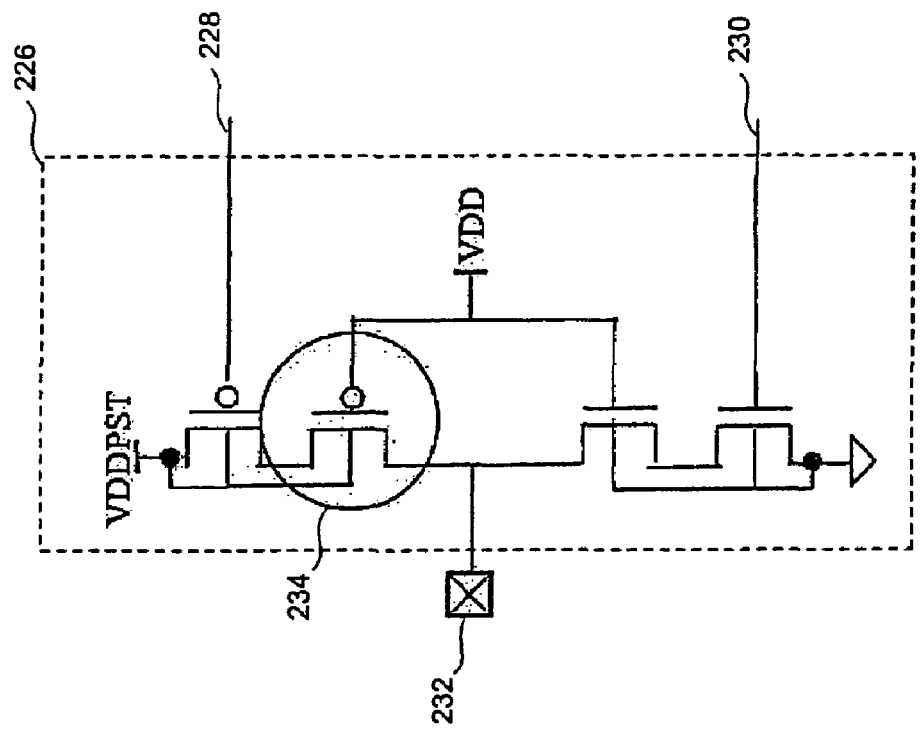
FIG. 2B presents a high voltage buffer module used in the conventional SGO I/O buffer circuit, as shown in FIG. 2A.

FIG. 2B presents a conventional high voltage buffer module 226 used in a conventional SGO I/O buffer circuit, as shown in FIG. 2A. The input signals are applied to a line 228 (PMOS gate drive) and a line 230 (NMOS gate drive). The output signal of an output pad 232 varies between VDDPST (e.g., 3.3V) and VSS (e.g., 0V).

An under-drive problem may be developed in the high voltage buffer module 226 during an energy-saving mode, thereby causing I/O buffer circuit failure. In this scenario, the high supply voltage VDDPST (3.3V) is reduced to the point where the difference between the high supply voltage and the low supply voltage (VDDPST−VDD) is approximately equal to, or less than, the absolute value of the threshold voltage ($V_{THP}$) of a PMOS transistor 234. In this condition, the PMOS transistor 234 has insufficient gate voltage drive to turn "ON", thereby resulting in I/O buffer circuit failure.

Figure 3:
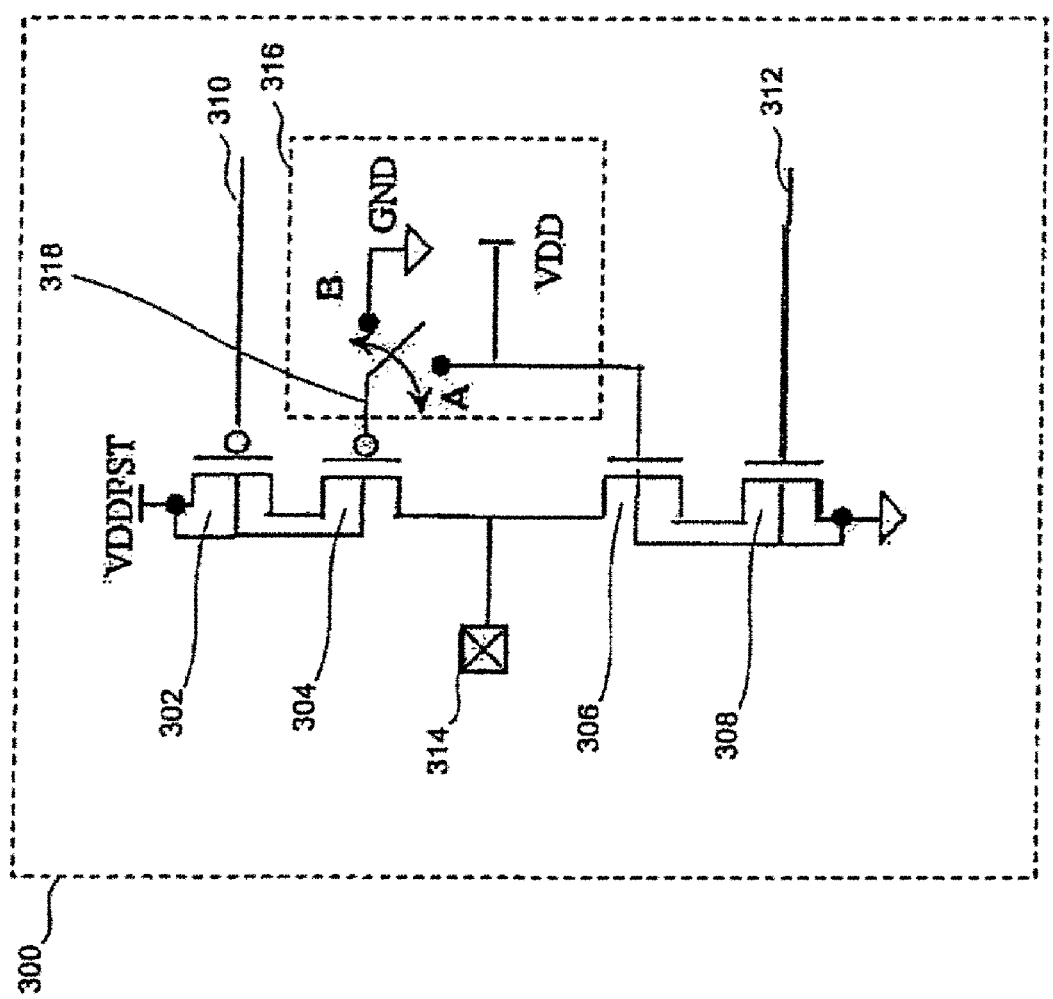
FIG. 3 presents a SGO high voltage buffer module used in an I/O buffer circuit, in accordance with one embodiment of the present invention.

FIG. 3 presents a high voltage buffer module 300, used in a SGO I/O buffer circuit, with dual bias voltage switching that eliminates the under-drive problems, in accordance with one embodiment of the present invention. Similar to the high voltage buffer module 226 shown in FIG. 2B, the high voltage buffer module 300 includes stacked SGO PMOS transistors 302 and 304, which, collectively, are referred to as a pull-up module, and stacked SGO NMOS transistors 306 and 308, which, collectively, are referred to as a pull-down module. The pull-up module is couple to a high supply voltage VDDPST, and the pull-down module is coupled to a complementary supply voltage that is lower than a low supply voltage VDD, such as ground. The input signals are applied to a line 310 (PMOS gate drive) and a line 312 (NMOS gate drive). The high voltage buffer module 300 differs from the high voltage buffer module 226, for example, by the use of a dual bias voltage (e.g., node A, which is VDD; or node B, which is GND, or ground) in lieu of the fixed bias voltage (i.e., VDD) used in the high voltage buffer module 226. The output of the high voltage buffer module 300 may be obtained at an output pad 314. Note that a person skilled in the art understands that the bias voltage GND can also be any voltage that is lower than VDD as a choice of design.

The selection of the bias voltage is essentially performed by a voltage detection circuit 316 that monitors VDDPST. Depending on this selection, the bias voltage at a node 318 ($V_{318}$) may be different. Essentially:

When $VDDPST < VDD + |V_{THP}|$, then $V_{318} = B$ (or GND)

When $VDDPST > VDD + |V_{THP}|$, then $V_{318} = A$ (or VDD).

The detection of the VDDPST and the switching of the bias voltage between VDD and GND, according to the above equations, will eliminate the SGO buffer under-drive anomaly.

Figure 4:
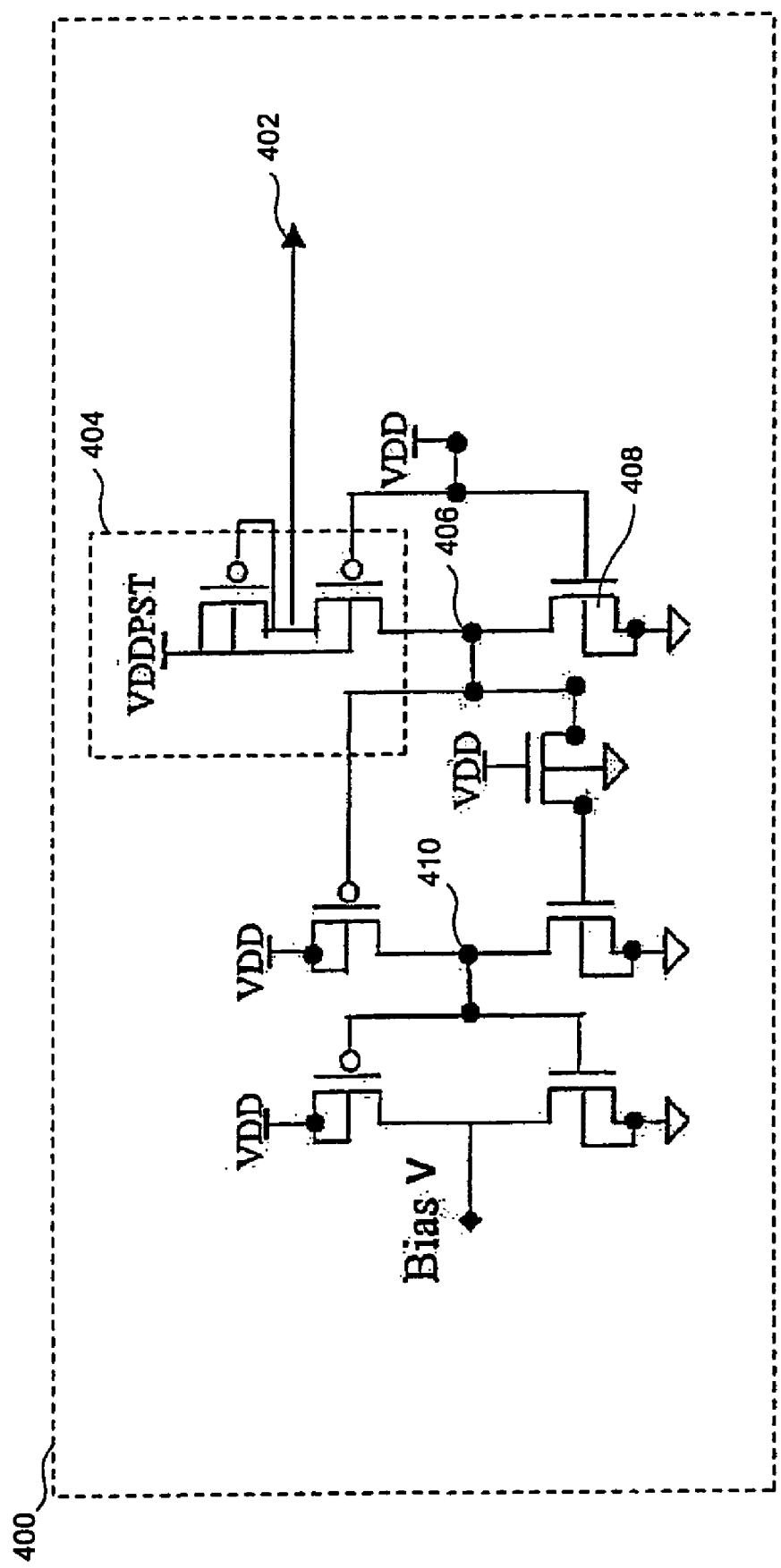
FIG. 4 presents a voltage detection circuit used in the SGO high voltage buffer module, in accordance the embodiment of the present invention.

FIG. 4 presents a voltage detection circuit 400 that generates the dual bias voltages, such as GND, or VDD, at the output "Bias V," in accordance with the embodiment of the present invention. The voltage detection circuit 400 includes a bias initiating module, constituted by a stacked PMOS transistor circuit 404 and a NMOS transistor 408, operating under the high supply voltage (VDDPST). The voltage detection circuit 400 also includes a level shifting buffer, constituted by a plurality of inverters, coupled between the bias initiating module and an output node, and operating under the low supply voltage (VDD).

The voltage detection circuit 400 monitors the VDDPST voltage at a line 402 at the junction of a stacked PMOS transistor circuit 404. In this example, two stacked PMOS transistors are shown, although it is understood by those skilled in the art that additional PMOS transistors may be implemented to provide VDDPST with voltage drops at the line 402. The voltage level across the PMOS transistor, whose gate is connected to its drain, drops a $|V_{THP}|$, where $V_{THP}$ is its threshold voltage. For n of such PMOS transistors, the voltage at the line 402 is the difference between the VDDPST voltage and the sum of all threshold voltages of the same (VDDPST$-n*|V_{THP}|$)

If the voltage at line 402 ($V_{402}$) is smaller than VDD+$|V_{THP}|$, the voltage at a node 406 will be at 0V, because a NMOS transistor 408 is turned "ON", while the stacked PMOS transistors in the stacked PMOS transistor circuit 404 are turned "OFF". With the node 406 tied to low, a node 410 is tied to high (or VDD), thereby further maintaining the "Bias V" line at 0V.

Conversely, if the voltage level at the line 402 is greater than VDD+$|V_{THP}|$, the voltage at the node 406 will be at a high level, such as VDDPST$-n*|V_{THP}|$, because the stacked PMOS transistors, in the stacked PMOS transistor circuit 404, are turned "ON." Meanwhile, although the NMOS transistor 408 is also turned "ON" by VDD, the NMOS transistor 408 would not substantially pull down the voltage level at node 406, because it is designed as a much weaker device than the stacked PMOS transistor circuit 404. With the node 406 tied to high, the node 410 is tied to low (or VSS), thereby maintaining the "Bias V" line at VDD.

The voltage detection circuit 400 can be embedded in a power cell within the IC. The circuit requires only micro-ampere standby current. It is noteworthy that no new external bias voltage is required. In addition, the output "Bias V" can be fed to various locations in an I/O buffer circuit, such that one single voltage detection circuit may serve many switch devices that require the output "Bias V."

Figure 5A:
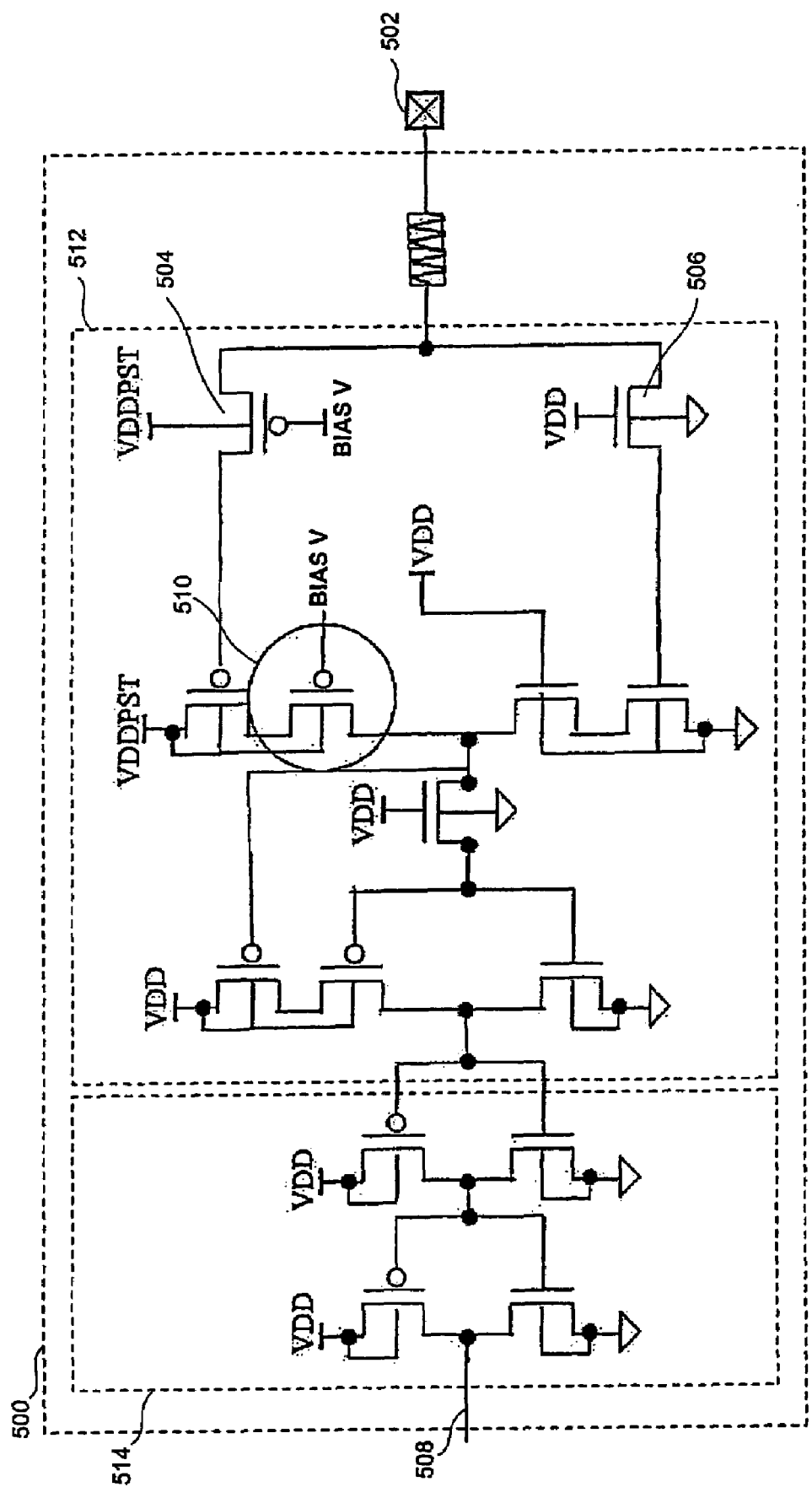
FIG. 5A presents a SGO I/O buffer circuit with an improved under-drive feature, in accordance with another embodiment of the present invention.

FIG. 5A presents a SGO buffer I/O circuit 500 with the improved under-drive feature using the voltage detector circuit 400, in accordance with another embodiment of the present invention. For the sake of clarity, only the switched output "Bias V" (i.e., VSS or VDD) of the voltage detection circuit 400, and not the circuit itself, is illustrated. An input signal, at an input pad 502, which is connected to a high voltage circuit, has a range of VDDPST (3.3V) to VSS (0V) that is applied to a PMOS transistor 504 and a NMOS transistor 506. An output line 508 connected to a low voltage circuit operates between VDD (1.8V) and VSS (0V). The PMOS transistor 504, whose substrate is connected to VDDPST, and a PMOS transistor 510 utilize the variable bias voltage (Bias V) on their gates to ensure that the under-drive problem is eliminated, and that they are biased properly. In other words, the high supply voltage (VDDPST) to low supply voltage (VDD) translation is performed by a level shifter 512, which essentially utilizes the variable bias voltage (Bias V) at the gate of the PMOS transistor 510 to eliminate the under-drive anomaly. A low voltage buffer module 514 provides buffering of transient signals from the level shifter 512 to the low voltage circuit (not shown) connected to the output line 508. With a 3.3V signal at the input pad 502, the output line 508 has a voltage of 1.8V. With a 0V signal at the input pad 502, the output line 508 has a voltage of 0V. Therefore, the SGO buffer I/O circuit 500 is a non-inverting buffer circuit. The variable bias voltage (Bias V), at the gates of the PMOS transistors 504 and 510, eliminates the under-drive problem for the SGO buffer I/O circuit 500.

Figure 5B:
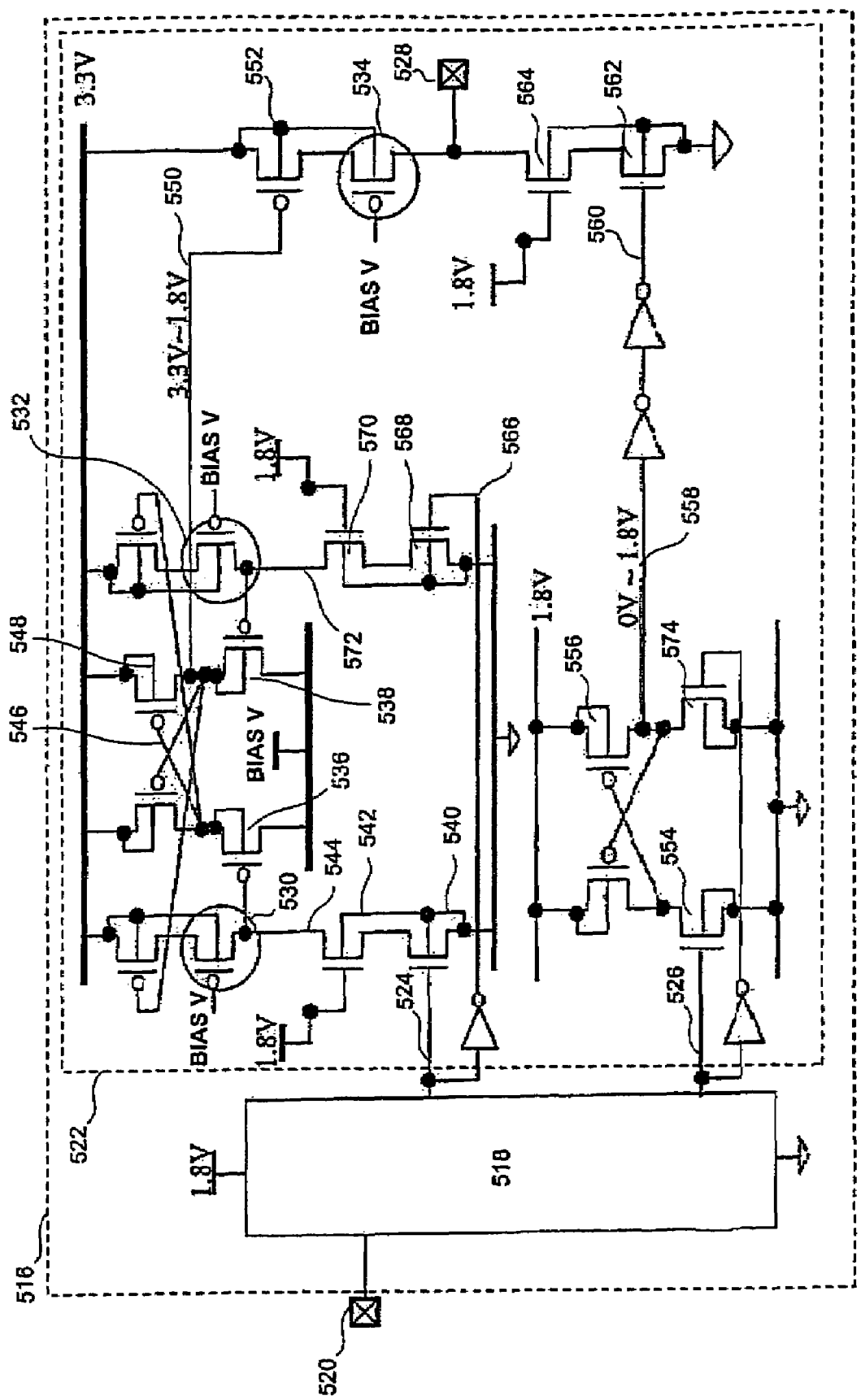
FIG. 5B presents a SGO I/O buffer circuit with an improved under-drive feature, in accordance with another embodiment of the present invention.

FIG. 5B presents another SGO I/O buffer circuit 516 with the improved under-drive feature using the voltage detection circuit 400, in accordance with another embodiment of the present invention. For the sake of clarity, only the switched output "Bias V" (i.e., VSS or VDD) of the voltage detection circuit 400, and not the circuit itself, is illustrated. A low supply voltage (VDD) non-inverting pre-driver circuit 518 receives an input signal at an input line 520 from a low voltage circuit operating at a low supply voltage, such as VDD. The pre-driver circuit 518 isolates the low voltage circuitry from transient signals output from a level shifter 522 at pre-driver output lines 524 and 526. The input signal at the input line 520 has a voltage range from VDD (1.8V) to VSS (0V). An output line 528 delivers the output of the SGO I/O buffer circuit 516 with a voltage range of 3.3V to 0V (i.e., VDDPST to VSS). PMOS transistors 530, 532 and 534 utilize the dual bias voltage "Bias V" on their gates, such that the under-drive problem is eliminated. PMOS transistors 536 and 538 utilize the dual bias voltage "Bias V" to maintain proper bias levels on the PMOS transistors in the SGO I/O buffer circuit 516.

When a high signal, such as 1.8V, is applied to the input line 520 of the pre-driver circuit 518, the pre-driver circuit 518 applies a high signal (1.8V) to the pre-driver output lines 524 and 526. A high signal at the output line 524 turns "ON" NMOS transistors 540 and 542, thus pulling a line 544 to low (0V). The low signal at the line 544 is applied to the gate of the PMOS transistor 536, thereby turning the PMOS transistor 536 "ON." As a result, the high signal (1.8V) is applied to a line 546. The high signal (1.8V) on the line 546 is then applied to the gate of a PMOS transistor 548, whose source is tied to 3.3V. The negative gate-to-source voltage on the PMOS transistor 548 turns "ON" the PMOS transistor 548, thereby pulling a line 550 to 3.3V. The line 550, which is at 3.3V, is connected to the gate of a PMOS transistor 552, whose source is tied to 3.3V. At this point, the PMOS transistor 552 is "OFF."

At the same time that a high signal is applied to the line 524, a high signal is also applied to the line 526. The line 526 is connected to the gate of a NMOS transistor 554. A high signal at the gate of the NMOS transistor 554 turns the transistor "ON," thereby passing a low signal to the gate of a PMOS transistor 556. With the source of the PMOS transistor 556 tied to 1.8V, the low signal at the gate turns the PMOS transistor 556 "ON," thereby applying the voltage 1.8V to a line 558. The line 558 passes the voltage 1.8V to a line 560 through two inverters. The 1.8V on the line 560 that connects to the gate of a NMOS transistor 562, thereby turning the NMOS transistor 562 "ON." Since the gate of a NMOS transistor 564 is tied to 1.8V, the NMOS transistor 564 is also "ON," thereby pulling the output line 528 to VSS (0V). To summarize, in this state, the PMOS transistors 552 and 534 are "OFF," while the NMOS transistors 562 and 564 are "ON," thereby pulling the output line 528 to ground (0V).

When a low signal (0V) is applied to the input line 520 of the pre-driver circuit 518, the pre-driver circuit 518 applies a low signal (0V) to the pre-driver output lines 524 and 526. The line 524 is tied, through an inverter via a line 566, to the gate of a NMOS transistor 568. Thus, the low signal on the line 524 translates, via the inverter, to a high signal at the gate of the NMOS transistor 568, thereby turning "ON" the NMOS transistor 568 and a NMOS transistor 570. With NMOS transistors 568 and 570 "ON," a line 572 is pulled to 0V, which turns the PMOS transistor 538 "ON," thereby pulling the line 550 to 1.8V. The 1.8V at the gate of the PMOS transistor 552 turns the PMOS transistors 552 and 534 "ON," thereby pulling the output line 528 to 3.3V. At the same time that a low signal is applied to the line 524, a low signal is also applied to the line 526. The line 526 is tied, through an inverter, to the gate of a NMOS transistor 574. Thus, the low signal on the line 526 applies a high supply voltage at the gate of the NMOS transistor 574, thereby turning the NMOS transistors 574 "ON." With the NMOS transistor 574 "ON", the line 558 is pulled to 0V, thereby pulling the line 560 to 0V. This turns the NMOS transistor 562 "OFF," thereby permitting the output line 528 to be pulled up to 3.3V by the PMOS transistors 534 and 552. The variable bias voltage (Bias V) at the gates of PMOS transistors 530, 532 and 534 eliminates the under-drive problems for the SGO buffer I/O circuit 500.

The above disclosure provides many different embodiments for implementing different features of the disclosure. Specific examples of components and processes are described to help clarify the disclosure. These are, of course, merely examples and are not intended to limit the disclosure from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A high voltage buffer module used in an input/output buffer circuit coupled between a high voltage circuit and a low voltage circuit, the high voltage buffer module being operated between a first supply voltage and its complementary second supply voltage, the high voltage buffer module comprising:
    a pull-up module, coupled between the first supply voltage and an output node, for outputting the first supply voltage to the output node, in response to an input signal; and
    a voltage detection circuit, connected to the pull-up module, including:
        a bias initiating module configured to operate under the first supply voltage and to change a first preliminary bias voltage to a second preliminary bias voltage when the first supply voltage is reduced to a predetermined level, and
        a level shifting buffer coupled with the bias initiating module and configured to operate under a second supply voltage and to adjust the first preliminary bias voltage to a voltage level no higher than the second supply voltage,
    wherein the voltage detection circuit is configured to provide the pull-up module with at least one bias voltage selected from a predetermined set of voltage levels.

2. The high voltage buffer module of claim 1 wherein the pull-up module comprises a first PMOS transistor coupled to the first supply voltage, with a gate of the first PMOS transistor configured to receive the input signal.

3. The high voltage buffer module of claim 2 wherein the pull-up module comprises a second PMOS transistor coupled with the first PMOS transistor in series, the second PMOS transistor having its drain connected to the output node and its gate configured to receive the bias voltage provided by the voltage detection circuit.

4. The high voltage buffer module of claim 3 wherein the voltage detection circuit is configured to output a first predetermined bias voltage to the gate of the second PMOS transistor under a normal operation.

5. The high voltage buffer module of claim 4 wherein the normal operation is defined as the first supply voltage minus a low supply voltage of the low voltage circuit is greater than an absolute value of a threshold voltage of the second PMOS transistor.

6. The high voltage buffer module of claim 5 wherein the voltage detection circuit is configured to output a second predetermined bias voltage, lower than the first predetermined bias voltage, to the gate of the second PMOS transistor, so that a voltage difference between its source and gate is sufficient to avoid a transistor under-drive problem.

7. The high voltage buffer module of claim 6 wherein the voltage detection circuit is configured to output the second predetermined bias voltage when the first supply voltage minus the low supply voltage is smaller than the absolute value of a threshold voltage of the second PMOS transistor.

8. The high voltage buffer module of claim 7 further comprising a pull-down module coupled in series with the pull-up module between the output node and the second supply voltage.

9. A high voltage buffer module with single gate oxide transistors used in an input/output buffer circuit coupled between a high voltage circuit and a low voltage circuit, the high voltage buffer module being operated between a first supply voltage and its complementary second supply voltage, the high voltage buffer module comprising:
    a pull-up module, coupled between the first supply voltage and an output node, configured to output the first supply voltage to the output node, in response to an input signal; and
    a voltage detection circuit, connected to the pull-up module, comprising
        a bias initiating module, configured to operate under the first supply voltage, and
        a level shifting buffer, coupled with the bias initiating module and configured to operate under the second supply voltage, the voltage detection circuit configured to provide the pull-up module with a first predetermined bias voltage or a second predetermined bias voltage smaller than the first predetermined voltage,
    wherein the voltage detection circuit is configured to provide the first predetermined bias voltage, when the first supply voltage minus a low supply voltage of the low voltage circuit is greater than a predetermined threshold value,
    wherein the voltage detection circuit is configured to provide the second predetermined bias voltage, when the first supply voltage minus a low supply voltage of the low voltage circuit is smaller than the predetermined threshold value.

10. The high voltage buffer module of claim 9 wherein the pull-up module comprises a first PMOS transistor coupled to the first supply voltage with a gate of the first PMOS transistor receiving the input signal.

11. The high voltage buffer module of claim 10 wherein the pull-up module comprises a second PMOS transistor coupled with the first PMOS transistor in series, and with its drain connected to the output node and its gate configured to receive the bias voltage from the voltage detection circuit.

12. The high voltage buffer module of claim 11 wherein the predetermined threshold value equals an absolute value of a threshold voltage of second PMOS transistor.

13. The high voltage buffer module of claim 12 further comprising a pull-down module coupled in series with the pull-up module between the output node and the second supply voltage.

14. A voltage detection circuit for operating a high voltage buffer module between a high voltage circuit operating up to a first supply voltage and a low voltage circuit operating up to a second supply voltage, the voltage detection circuit comprising:
a bias initiating module, configured to operate under the first supply voltage for changing a first preliminary bias voltage to a second preliminary bias voltage when the first supply voltage is reduced to a predetermined level; and
a level shifting buffer, coupled with the bias initiating module and configured to operate under the second supply voltage, for adjusting the first preliminary bias voltage to a voltage no higher than the second supply voltage,
wherein the level shifting buffer is configured to output two bias signals to the high voltage buffer module for maintaining the operation of the high voltage buffer module.

15. The voltage detection circuit of claim 14 wherein the bias initiating module further comprises a NMOS transistor having its source grounded and its gate connected to the second supply voltage.

16. The voltage detection circuit of claim 15 wherein the bias initiating module further comprises a first PMOS transistor having its source coupled to the first supply voltage, its gate connected to the second supply voltage, and its drain connected to the drain of the NMOS transistor.

17. The voltage detection circuit of claim 16 wherein the bias initiating module is configured to provide the first preliminary bias voltage, when the reduced first supply voltage minus the second supply voltage is greater than a threshold voltage of the first PMOS transistor.

18. The voltage detection circuit of claim 17 wherein the bias initiating module is configured to provide the second preliminary bias voltage, when the reduced first supply voltage minus the second supply voltage is smaller than the threshold voltage of the first PMOS transistor.

19. The voltage detection circuit of claim 18 further comprising at least on second PMOS transistor coupled, in series, between the first supply voltage and the first PMOS transistor.

20. The voltage detection circuit of claim 14 wherein the level shifting buffer further comprises at least one inverter.

21. The high voltage buffer module of claim 1, wherein the level shifting buffer further comprises at least one inverter.

22. The high voltage buffer module of claim 1, wherein the bias initiating module further includes a NMOS transistor having a source thereof connected to ground and a gate thereof connected to the second supply voltage.

23. The high voltage buffer module of claim 22, wherein the bias initiating module further includes a first PMOS transistor having a source thereof coupled to the first supply voltage, a gate thereof connected to the second supply voltage, and a drain thereof connected to the drain of the NMOS transistor.

24. The high voltage buffer module of claim 23, wherein the bias initiating module is configured to output the first preliminary bias voltage when the reduced first supply voltage minus the second supply voltage is greater than a threshold voltage of the first PMOS transistor.

25. The high voltage buffer module of claim 17, wherein the bias initiating module is configured to output the second preliminary bias voltage when the reduced first supply voltage minus the second supply is less than the threshold voltage of the first PMOS transistor.

26. The high voltage buffer module of claim 25, wherein the bias initiating module further includes at least one second PMOS transistor coupled, in series, between the first supply voltage and the first PMOS transistor.

27. The high voltage buffer module of claim 26, wherein the at least one second PMOS transistor has a gate thereof connected to a source thereof for providing the first supply voltage with a voltage drop thereacross.

28. The high voltage buffer module of claim 9, wherein the bias initiating module further includes at least one second PMOS transistor coupled, in series, between the first supply voltage and the first PMOS transistor.

29. The high voltage buffer module of claim 28, wherein the at least one second PMOS transistor has its gate connected to its source for providing the first supply voltage with a voltage drop thereacross.

30. A voltage detection circuit for operating a high voltage buffer module between a high voltage circuit operating up to a first supply voltage and a low voltage circuit operating up to a second supply voltage, the voltage detection circuit comprising:
a bias initiating module including
a NMOS transistor having a source thereof grounded and a gate thereof connected to the second supply voltage,
a first PMOS transistor having a source thereof coupled to the first supply voltage, a gate thereof connected to the second supply voltage, and a drain thereof connected to the drain of the NMOS transistor,
at least one second PMOS transistor coupled, in series, between the first supply voltage and the first PMOS transistor having a gate thereof connected to a source thereof for providing the first supply voltage with a voltage drop thereacross, the bias initiating module configured to operate under the first supply voltage for changing a first preliminary bias voltage to a second preliminary bias voltage when the first supply voltage is reduced to a predetermined level; and
a level shifting buffer, coupled with the bias initiating module and configured to operate under the second supply voltage, for adjusting the first preliminary bias voltage to a voltage no higher than the second supply voltage,
wherein the level shifting buffer is configured to output two bias signals to the high voltage buffer module for maintaining the operation of the high voltage buffer module.

31. The voltage detection circuit of claim 30, wherein the bias initiating module is configured to provide the first preliminary bias voltage, when the reduced first supply voltage minus the second supply voltage is greater than a threshold voltage of the first PMOS transistor.

32. The voltage detection circuit of claim 31, wherein the bias initiating module is configured to provide the second preliminary bias voltage, when the reduced first supply voltage minus the second supply voltage is smaller than the threshold voltage of the first PMOS transistor.

33. The voltage detection circuit of claim 32, wherein the level shifting buffer further comprises at least one inverter.

* * * * *